(12) United States Patent
Cao et al.

(10) Patent No.: US 8,809,105 B2
(45) Date of Patent: Aug. 19, 2014

(54) METHOD OF PROCESSING A SEMICONDUCTOR ASSEMBLY

(75) Inventors: Jinbo Cao, Rexford, NY (US); Bastiaan Arie Korevaar, Schenectady, NY (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 13/523,059

(22) Filed: Jun. 14, 2012

(65) Prior Publication Data

US 2013/0337600 A1 Dec. 19, 2013

(51) Int. Cl.
*H01L 21/00* (2006.01)

(52) U.S. Cl.
USPC .............. 438/86; 438/45; 438/57; 438/102; 257/184; 257/613; 257/E31.126

(58) Field of Classification Search
USPC ........ 257/184, 613, E31.126; 438/45, 57, 74, 438/84, 95, 98, 102, 509; 136/256
See application file for complete search history.

(56) References Cited

U.S. PATENT DOCUMENTS

2009/0121320 A1* 5/2009 Tsuda et al. ................ 257/613
2010/0313951 A1* 12/2010 Nalamasu et al. ............ 136/256

OTHER PUBLICATIONS

Rohatgi et al., "An Improved Understanding of Efficiency Limiting Defects in Polycrystalline CdTe/CdS Solar Cells", Twenty Second IEEE Photovoltaic Specialists Conference, vol. 2, Oct. 7-11, 1991, Location: Las Vegas, NV, pp. 962-966.
Nair et al., "Formation of Conductive CdO Layer on CdS Thin Films During Air Heating", Semiconductor Science and Technology, vol. 16, 2001, pp. 651-656.
Metin et al., "Annealing studies on CBD grown CdS Thin Films", Journal of Crystal Growth, vol. 258, Issues 1-2, Oct. 2003, pp. 141-148.
Han et al., "Annealing Effects on the Chemical Deposited CdS Films and the Electrical Properties of CdS/CdTe Solar Cells", Materials Research Bulletin, vol. 46, Issue 2, Feb. 2011, pp. 194-198.
Cao et al.,"Manufacturing Methods for Semiconductor Devices",Pending U.S. Appl. No. 13/329,418, filed Dec. 19, 2011, 30 Pages.

* cited by examiner

*Primary Examiner* — Mark A Laurenzi
(74) *Attorney, Agent, or Firm* — MacMillan, Sobanski & Todd, LLC

(57) ABSTRACT

A method for processing a semiconductor assembly is presented. The method includes thermally processing a semiconductor assembly in a non-oxidizing atmosphere at a pressure greater than about 10 Torr. The semiconductor assembly includes a semiconductor layer disposed on a support, and the semiconductor layer includes cadmium and sulfur.

20 Claims, 7 Drawing Sheets

METHOD OF PROCESSING A SEMICONDUCTOR ASSEMBLY

BACKGROUND

The invention generally relates to a method of processing a semiconductor assembly. More particularly, the invention relates to a method of processing a semiconductor layer including cadmium and sulfur.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. The window layer further functions to form a heterojunction (p-n junction) in combination with an absorber layer. The window layer desirably is thin enough and has a wide enough bandgap (2.4 eV or more) to transmit most available light through to the absorber layer. Cadmium telluride/cadmium sulfide (CdTe/CdS) and copper indium gallium selenide/cadmium sulfide (CIGS/CdS) heterojunction-based photovoltaic cells are examples of thin film solar cells, where CdS functions as the window layer.

However, thin film photovoltaic devices may suffer reduced performance due to the loss of photons in the window layer and/or poor charge collection at the p-n junction. Thus, it may be desirable to increase the light transmission of the window layer and/or improve the junction performance by improving the quality of the window layer.

BRIEF DESCRIPTION OF THE INVENTION

Embodiments of the present invention are included to meet these and other needs. One embodiment is a method. The method includes thermally processing a semiconductor assembly in a non-oxidizing atmosphere at a pressure greater than about 10 Torr. The semiconductor assembly includes a semiconductor layer disposed on a support, and the semiconductor layer includes cadmium and sulfur.

One embodiment is a method. The method includes disposing a semiconductor layer on a support by physical vapor deposition to form a semiconductor assembly, wherein the semiconductor layer includes cadmium and sulfur. The method further includes thermally processing the semiconductor assembly in a non-oxidizing atmosphere at a pressure greater than about 10 Torr.

One embodiment is a method. The method includes disposing a transparent layer on a support and disposing a semiconductor layer on the transparent layer by sputtering to form a semiconductor assembly, wherein the semiconductor layer includes cadmium and sulfur. The method further includes thermally processing the semiconductor assembly in a non-oxidizing atmosphere at a temperature in a range from about 500 degrees Celsius to about 700 degrees Celsius, and at a pressure greater than about 10 Torr. The method further includes disposing an absorber layer on the semiconductor layer, and disposing a back contact layer on the absorber layer.

DRAWINGS

These and other features, aspects, and advantages of the present invention will become better understood when the following detailed description is read with reference to the accompanying drawings, wherein.

DETAILED DESCRIPTION

Figure 1:
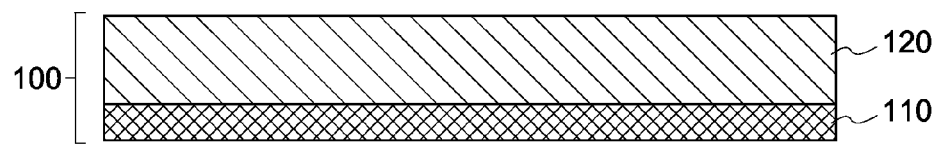
FIG. 1 is a schematic of a semiconductor assembly, according to one embodiment of the invention.

As discussed in detail below, some of the embodiments of the invention relate to a method for processing a semiconductor assembly including a semiconductor layer. More particularly, some of the embodiments of the invention relate to methods for treating a cadmium sulfide (CdS)-based semiconductor layer, employed as a window layer in thin-film photovoltaic devices.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The terms "transparent region" and "transparent layer" as used herein, refer to a region or a layer that allows an average transmission of at least 70% of incident electromagnetic radiation having a wavelength in a range from about 350 nm to about 850 nm.

As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

As discussed in detail below, some embodiments of the invention are directed to a method of processing a semiconductor assembly 100. The method is described with reference to FIGS. 1-5. In some embodiments, the method includes thermally processing a semiconductor assembly 100 in a non-oxidizing atmosphere at a pressure greater than about 10 Torr.

The term "semiconductor assembly" as used herein refers to an assembly of one or more layers disposed on a support, wherein at least one of the layers includes a semiconductor layer. As indicated, for example, in FIG. 1, the semiconductor assembly 100 includes a semiconductor layer 120 disposed on a support 110. In some embodiments, as indicated, for example, in FIGS. 2 and 3, one or more intervening layers (112, 114, 150, or 130) may be further interposed between the support 110 and the semiconductor layer 120. The term "semiconductor layer" as used herein refers to a layer including a semiconductor material.

In some embodiments, the semiconductor layer 120 includes cadmium and sulfur. In some embodiments, the semiconductor layer 120 includes cadmium sulfide, oxygenated cadmium sulfide, or combinations thereof. In some embodiments, the semiconductor layer 120 includes oxygenated cadmium sulfide having an oxygen content in a range from about 1 weight percent to about 25 weight percent. In particular embodiments, the semiconductor layer 120 includes oxygenated cadmium sulfide having an oxygen content in a range from about 1 weight percent to about 15 weight percent. In particular embodiments, the semiconductor layer 120 includes oxygenated cadmium sulfide having an oxygen content in a range from about 1 weight percent to about 10 weight percent.

In some embodiments, the semiconductor assembly may be pre-fabricated. In some other embodiments, the method may further include the step of disposing the semiconductor layer 120 on the support 110. In some embodiments, the method includes the step of disposing the semiconductor layer 120 on the support 110 by suitable deposition techniques, such as, for example, physical vapor deposition (PVD), atomic layer deposition (ALD), chemical bath deposition (CBD), electrochemical deposition (ECD), chemical vapor deposition (CVD) and close-space sublimation (CSS). In particular embodiments, the method includes the step of disposing the semiconductor layer 120 on the support 110 by physical vapor deposition. In particular embodiments, the method includes the step of disposing the semiconductor layer 120 on the support 110 by sputtering.

As noted earlier, the method further includes the step of thermally processing the semiconductor assembly 100 in a non-oxidizing atmosphere. In some embodiments, thermal processing of the assembly 100 includes heating the assembly 100 at a treatment temperature, under pressure conditions, and for time duration sufficient to allow formation of a semiconductor layer having the desired electrical and optical properties.

The term "non-oxidizing atmosphere" as used herein refers to an atmosphere for thermal processing that is substantially free of an oxidizing agent. Non-limiting examples of oxidizing agents include oxygen, water vapor, and nitrous oxide. The term "substantially free" as used herein means that the annealing atmosphere may typically include impurity levels (less than about 100 parts per million) of the oxidizing agents, and does not include any purposely added oxidizing agent. In some embodiments, the non-oxidizing atmosphere is substantially free of oxygen. In some embodiments, the oxygen partial pressure in the non-oxidizing atmosphere is less than about 0.1 Torr. In some embodiments, the oxygen partial pressure in the non-oxidizing atmosphere is less than about 0.01 Torr. The term "partial pressure" as used herein refers to the pressure that a gas (for example, oxygen) in a mixture of gases would exert if it alone occupied the whole volume occupied by the mixture.

In some embodiments, the non-oxidizing atmosphere includes an inert gas. The term "inert gas" as used herein refers to a gas, which does not undergo chemical reactions with the semiconductor material under a set of given conditions (such as, for example, the thermal processing conditions). In particular embodiments, the non-oxidizing atmosphere includes nitrogen, argon, or combinations thereof.

In some embodiments, thermal processing is performed at a pressure such that the sublimation of one or more constituents of the semiconductor layer 120 during the thermal processing step is minimized. In some embodiments, thermal processing is performed at a pressure greater than about 10 Torr. In some embodiments, thermal processing is performed at a pressure greater than about 100 Torr. In some embodiments, thermal processing is performed at a pressure in a range from about 50 Torr to about 10 Atm. In particular embodiments, thermal processing is performed at a pressure in a range from about 100 Torr to about 2 Atm.

In some embodiments, the method may further include a step of applying an overpressure of one more constituent materials of the semiconductor layer 120. The term "overpressure" as used herein refers to a pressure greater than the equilibrium pressure defined by thermodynamics at the given conditions. It should be noted, that the non-oxidizing atmosphere may include a small amount of vapor phase of the semiconductor layer constituent materials because of sublimation during thermal process. The term "overpressure" described herein refers to the vapor pressure in addition to the vapor pressure generated because of the sublimed constituent materials.

In some embodiments, thermal processing is performed with an overpressure of a vapor phase including cadmium, sulfur, or combinations thereof. In such embodiments, the method may further include the step of providing a vapor phase of cadmium, sulfur, or combinations thereof to the non-oxidizing atmosphere. In particular embodiments, the non-oxidizing atmosphere further includes an overpressure of vapor phase of sulfur.

In some embodiments, thermally processing the semiconductor assembly 100 includes heating the semiconductor assembly 100 at a temperature in a range from about 500 degrees Celsius to about 750 degrees Celsius. In some embodiments, thermally processing the semiconductor assembly 100 includes heating the semiconductor assembly 100 at a temperature in a range from about 500 degrees Celsius to about 700 degrees Celsius. In some embodiments, thermally processing the semiconductor assembly 100 includes heating the semiconductor assembly 100 at a temperature in a range from about 550 degrees Celsius to about 700 degrees Celsius.

In some embodiments, thermal processing is performed for a time duration in a range from about 2 minutes to about 40 minutes. In some embodiments, thermal processing is performed for a time duration in a range from about 5 minutes to about 20 minutes.

In some embodiments, the method described herein may advantageously provide for annealing of the semiconductor layer to recrystallize the semiconductor layer while minimizing the sublimation of the constituent materials during the thermal processing step. Without being bound by any theory, it is believed that the method may advantageously provide for a crystalline semiconductor layer that has the desired optical and electrical properties to function as a window layer in a photovoltaic device. The term "window layer" as used herein refers to a semiconducting layer that is substantially transparent and is capable of forming a heterojunction with an absorber layer.

In one embodiment, the method includes disposing a semiconductor layer 120 on a support 110 by physical vapor deposition to form a semiconductor assembly 100, wherein the semiconductor layer 120 includes cadmium and sulfur. The method further includes thermally processing the semiconductor assembly 100 in a non-oxidizing atmosphere at a pressure greater than about 10 Torr.

As described in detail below, some embodiments of the invention are directed to a method of manufacturing a photovoltaic device 200 or a component thereof. Referring to FIGS. 2-5, in some embodiments, the semiconductor assembly 100 includes one or more intervening layers (for example, 112, 114, 130, 150) disposed between the support 110 and the semiconductor layer 120. In some embodiments, the method includes disposing one or more intervening layers between the support 110 and the semiconductor layer 120 before the step of disposing the semiconductor layer 120.

In some embodiments, the semiconductor assembly 100 is suitable for a photovoltaic device including a "superstrate" configuration of layers. In such embodiments, the semiconductor assembly 100 further includes a transparent layer 112 interposed between the support 110 and the semiconductor layer 120. As further illustrated in FIG. 4, in such embodiments, the solar radiation 10 enters from the support 110, and after passing through the transparent layer 112 and the semiconductor layer (sometimes referred to in the art as window layer) 120, may enter the absorber layer 130, where the conversion of electromagnetic energy of incident light (for instance, sunlight) to electron-hole pairs (that is, to free electrical charge) occurs.

Figure 2:
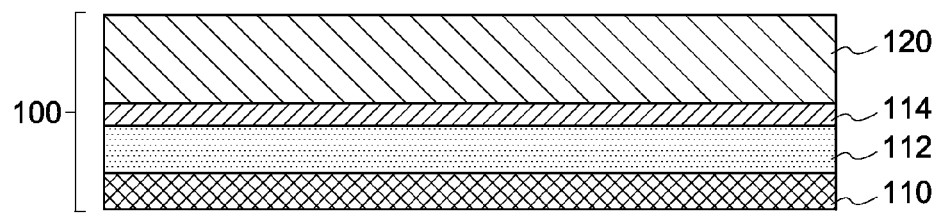
FIG. 2 is a schematic of a semiconductor assembly, according to one embodiment of the invention.
Figure 4:
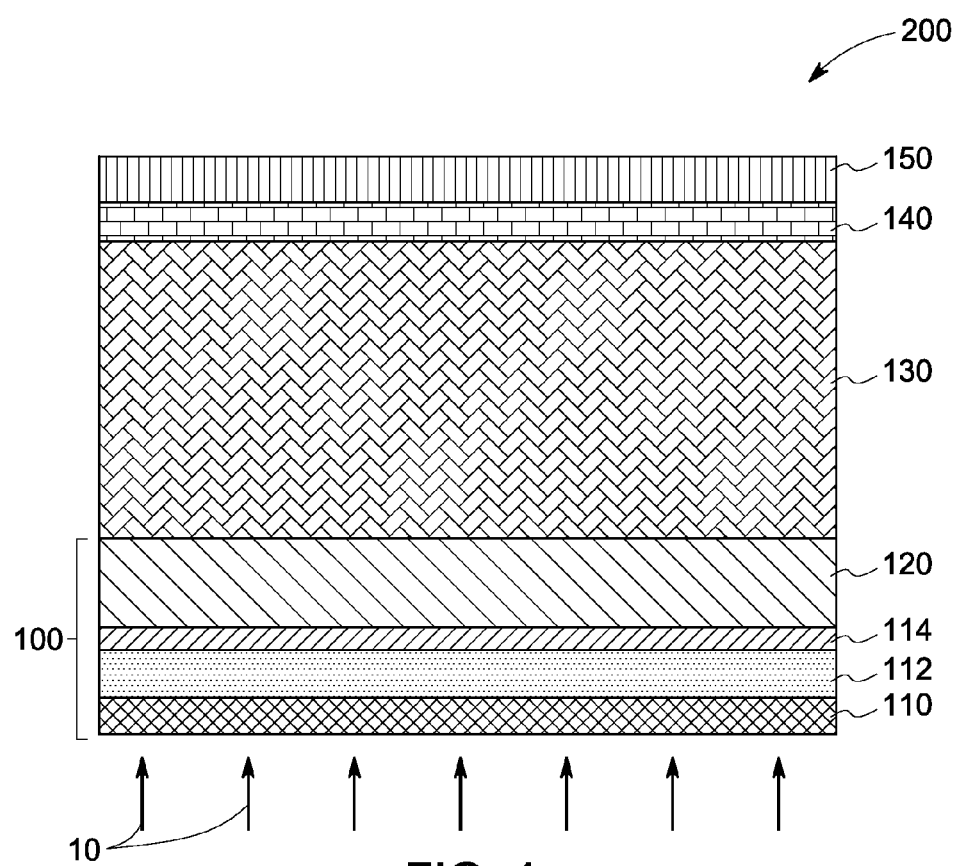
FIG. 4 is a schematic of a photovoltaic device, according to one embodiment of the invention.

In some embodiments, the semiconductor layer 120 is disposed directly on the transparent layer 112. In an alternate embodiment, an additional buffer layer 114 is interposed between the transparent layer 112 and the semiconductor layer 120, as indicated in FIGS. 2 and 4.

In some embodiments, the support 110 is transparent over the range of wavelengths for which transmission through the support 110 is desired. In some embodiments, the support 110 may be transparent to visible light having a wavelength in a range from about 400 nm to about 1000 nm. In some embodiments, the support 110 includes a material capable of withstanding heat treatment temperatures greater than about 600° C., such as, for example, silica or borosilicate glass. In some other embodiments, the support 110 includes a material that has a softening temperature lower than 600° C., such as, for example, soda-lime glass or a polyimide. In some embodiments certain other layers may be disposed between the transparent layer 112 and the support 110, such as, for example, an anti-reflective layer or a barrier layer (not shown).

In some embodiments, the transparent layer 112 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide (ZnSnOx), cadmium magnesium oxide, gallium oxide, or combinations thereof. Non-limiting examples of suitable materials for the buffer layer 114 include tin dioxide ($SnO_2$), zinc tin oxide (ZTO), zinc-doped tin oxide ($SnO_2$:Zn), zinc oxide (ZnO), indium oxide ($In_2O_3$), or combinations thereof.

Referring again to FIGS. 2 and 4, in some embodiments, the method may further include disposing a transparent layer 112 on a support 110 by any suitable technique, such as sputtering, chemical vapor deposition, spin coating, spray coating, or dip coating. Referring to FIG. 2, in some embodiments, an optional buffer layer 114 may be deposited on the transparent layer 112 using sputtering. The semiconductor layer 120 may be then deposited on the transparent layer 112 using a suitable technique as described earlier, followed by the thermal processing step.

In one embodiment, the method further includes the step of disposing an absorber layer 130 on the semiconductor layer 120 after the step of thermal processing, as indicated in FIG. 4. The term "absorber layer" as used herein refers to a semiconducting layer wherein the solar radiation is absorbed. In one embodiment, a photoactive material is used for forming the absorber layer 130. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium disulfide (CIS), copper indium diselenide (CISe), copper indium gallium sulfide (CIGS), copper indium gallium diselenide (CIGSe), copper indium gallium sulfur selenium (CIGSSe), copper indium gallium aluminum sulfur selenium ($Cu(In,Ga,Al)(S,Se)_2$), copper zinc tin sulfide (CZTS), or combinations thereof. The above-mentioned photo-active semiconductor materials may be used alone or in combination. Further, these materials may be present in more than one layer, each layer having different type of photo-active material or having combinations of the materials in separate layers. In certain embodiments, the absorber layer 130 includes cadmium telluride (CdTe).

In some embodiments, the absorber layer 130 may be deposited using a suitable method, such as, close-space sublimation (CSS), vapor transport deposition (VTD), ion-assisted physical vapor deposition (IAPVD), atmospheric plasma chemical vapor deposition (APCVD) radio frequency or pulsed magnetron sputtering (RFS or PMS), plasma enhanced chemical vapor deposition (PECVD), or electrochemical deposition (ECD).

In some embodiments, the semiconductor (window) layer 120 and the absorber layer 130 may be doped with a p-type dopant or an n-type dopant to form a heterojunction. In some embodiments, the semiconductor (window) layer 120 includes an n-type semiconductor material. In such embodiments, the absorber layer 130 may be doped to be p-type to form an "n-p" heterojunction. In some embodiments, the semiconductor (window) layer 120 may be doped to be n-type and the absorber layer 130 may be doped such that it effectively forms an n-i-p configuration, using a p+-semiconductor layer on the backside of the absorber layer 130.

In some embodiments, as indicated in FIG. 4, the method further includes disposing a p+-type semiconductor layer 140 on the absorber layer 130. In some embodiments, the method further includes disposing a back contact layer 150 on the absorber layer 130. The term "p+-type semiconductor layer" as used herein refers to a semiconductor layer having an excess mobile p-type carrier or hole density compared to the p-type charge carrier or hole density in the absorber layer 130. In some embodiments, the p+-type semiconductor layer has a p-type carrier density in a range greater than about $1 \times 10^{16}$ per cubic centimeter. The p+-type semiconductor layer 140 may be used as an interface between the absorber layer 130 and the back contact layer 150, in some embodiments.

In one embodiment, the p+-type semiconductor layer 140 includes a heavily doped p-type material including amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSr-CuOS, LaCuOSe$_{0.6}$Te$_{0.4}$, BiCuOSe, BiCaCuOSe, PrCuOSe, NdCuOS, Sr$_2$Cu$_2$ZnO$_2$S$_2$, Sr$_2$CuGaO$_3$S, (Zn,Co,Ni)O$_x$, or combinations thereof. In another embodiment, the p+-type semiconductor layer 140 includes a heavily doped p+-doped material including zinc telluride, magnesium telluride, manganese telluride, beryllium telluride, mercury telluride, arsenic telluride, antimony telluride, copper telluride, or combinations thereof. In some embodiments, the p+-doped material further includes a dopant including copper, gold, nitrogen, phosphorus, antimony, arsenic, silver, bismuth, sulfur, sodium, or combinations thereof.

In some embodiments, the back contact layer 150 is disposed directly on the absorber layer 130 (not shown). In some other embodiments, the back contact layer 150 is disposed on the p+-type semiconductor layer 140 disposed on the absorber layer 130, as indicated in FIG. 4. In one embodiment, the back contact layer 150 includes gold, platinum, molybdenum, tungsten, tantalum, palladium, aluminum, chromium, nickel, or silver. In certain embodiments, another metal layer (not shown), for example, aluminum, may be disposed on the metal layer 150 to provide lateral conduction to the outside circuit.

Referring again to FIG. 4, a p+-type semiconducting layer 140 may be further disposed on the absorber layer 130 by depositing a p+-type material using any suitable technique, for example PECVD, in one embodiment. In an alternate embodiment, a p+-type semiconductor layer 140 may be disposed on the absorber layer 130 by chemically treating the absorber layer 130 to increase the carrier density on the backside (side in contact with the metal layer and opposite to the window layer) of the absorber layer 130. In some embodiments, the photovoltaic device 200 may be completed by depositing a back contact layer, for example, a metal layer 150 on the p+-type semiconductor layer 140. One or more of the absorber layer 130, the back contact layer 150, or the p+-type layer 140 (optional) may be may be further heated or subsequently treated (for example, annealed) after deposition to manufacture the photovoltaic device 100.

In one exemplary embodiment, the method includes disposing a transparent layer 112 on a support 110 and disposing a semiconductor layer 120 on the transparent layer 112 by sputtering to form a semiconductor assembly 100, wherein the semiconductor layer 120 includes cadmium and sulfur. The method further includes thermally processing the semiconductor assembly 100 in a non-oxidizing atmosphere at a temperature in a range from about 500 degrees Celsius to about 700 degrees Celsius, and at a pressure greater than about 10 Torr. The method further includes disposing an absorber layer 130 on the semiconductor layer 120, and disposing a back contact layer 150 on the absorber layer 130.

Figure 3:
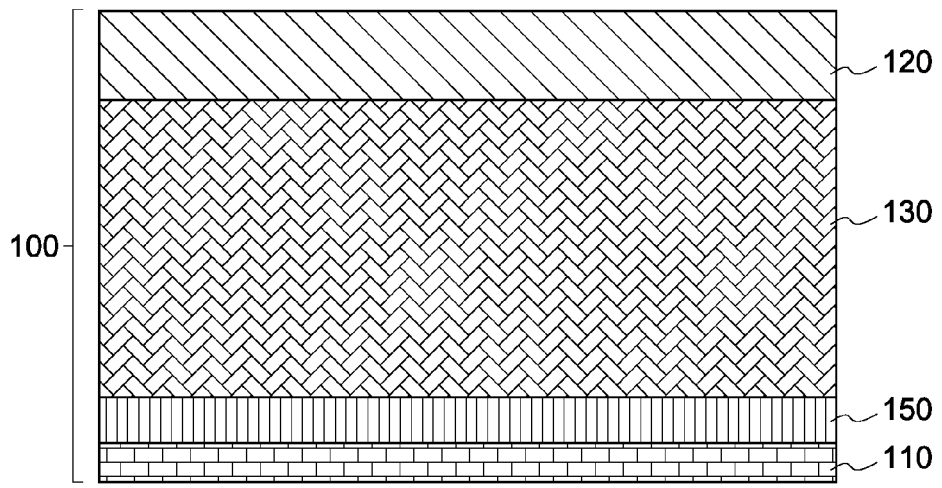
FIG. 3 is a schematic of a semiconductor assembly, according to one embodiment of the invention.
Figure 5:
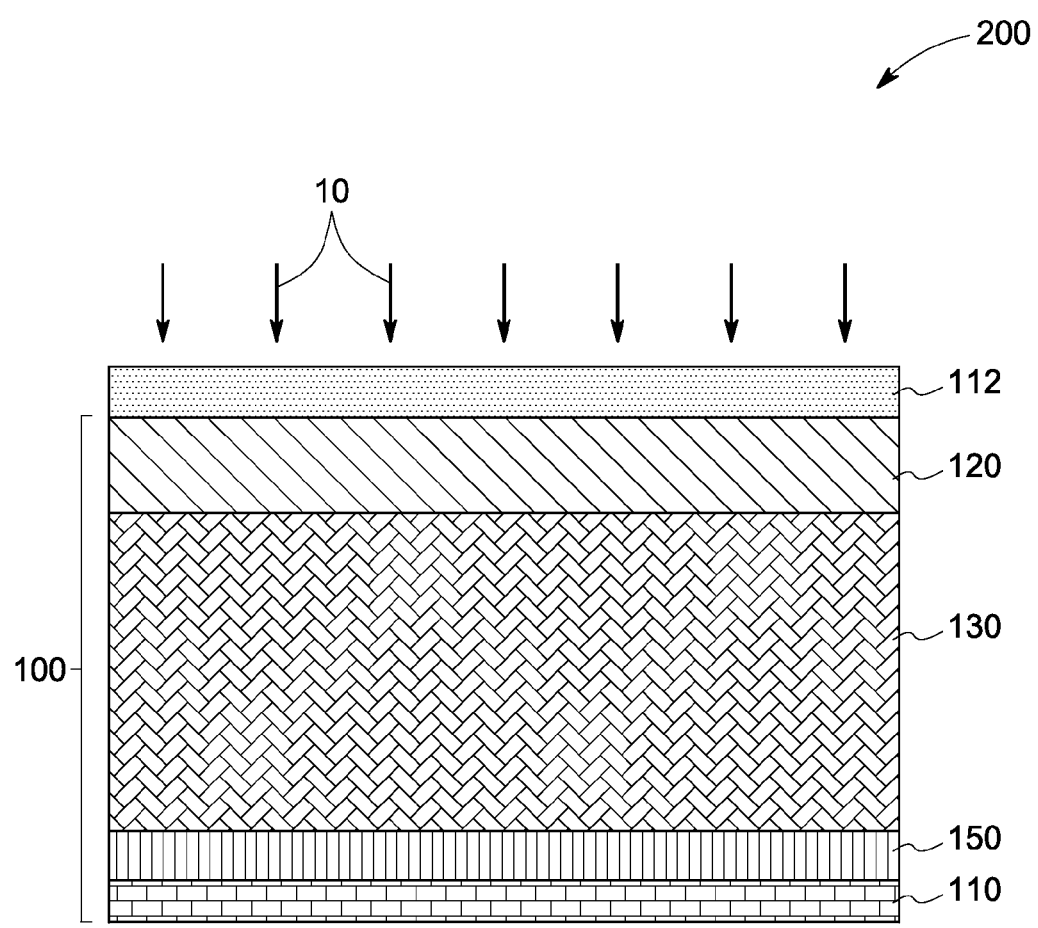
FIG. 5 is a schematic of a photovoltaic device, according to one embodiment of the invention.

In alternative embodiments, as illustrated in FIGS. 3 and 5, a method of processing a semiconductor assembly 100 suitable for photovoltaic device 200 including a "substrate" configuration is presented. In such embodiments, as indicated in FIGS. 3 and 5, the semiconductor assembly 100 includes a back contact layer 150 disposed on a support 110. An absorber layer 130 is further interposed between the back contact layer 150 and the semiconductor layer 120. In such embodiments, the method may further include thermally processing the semiconductor assembly 100 followed by the step of disposing a transparent layer 112 on the semiconductor layer 120, as indicated in FIG. 5.

As illustrated in FIG. 5, in such embodiments, the solar radiation 10 enters from the transparent layer 112 and after passing through the semiconductor layer 120, enters the absorber layer 130, where the conversion of electromagnetic energy of incident light (for instance, sunlight) to electron-hole pairs (that is, to free electrical charge) occurs.

In some embodiments, the composition and method of deposition of the layers illustrated in FIGS. 3 and 5, such as, the support 110, the transparent layer 112, the semiconductor layer 120, the absorber layer 130, and the back contact layer 150 may have the same composition and method of deposition as described above in FIGS. 2 and 4 for the superstrate configuration.

EXAMPLES

Example 1

Preparation of CdS/ZnO/FTO/Glass Sample

A multi-layered sample (Sample 1) including oxygenated CdS (CdS:O (5% O)) was prepared by depositing cadmium tin oxide (CTO) on a glass support followed by deposition of zinc tin oxide (ZTO) layer on the CTO. Cadmium sulfide (5 molar % oxygen in the CdS layer) was then deposited on the ZTO layer by DC sputtering.

Example 2

Annealing of CdS/ZnO/FTO/Glass Sample

The multi-layered sample (semiconductor assembly 100) prepared in Example 1 was subjected to an annealing step at 630° C. for 10 min in a nitrogen (N$_2$) atmosphere at 100 Torr (Sample 2a). The multi-layered sample prepared in Example 1, which was not subjected to an annealing step, was also used as a Comparative Sample (Sample 2b). The photovoltaic cells were completed by depositing a layer of cadmium telluride (CdTe) and formation of a back contact on the annealed CdS:O layer.

Figure 6A:
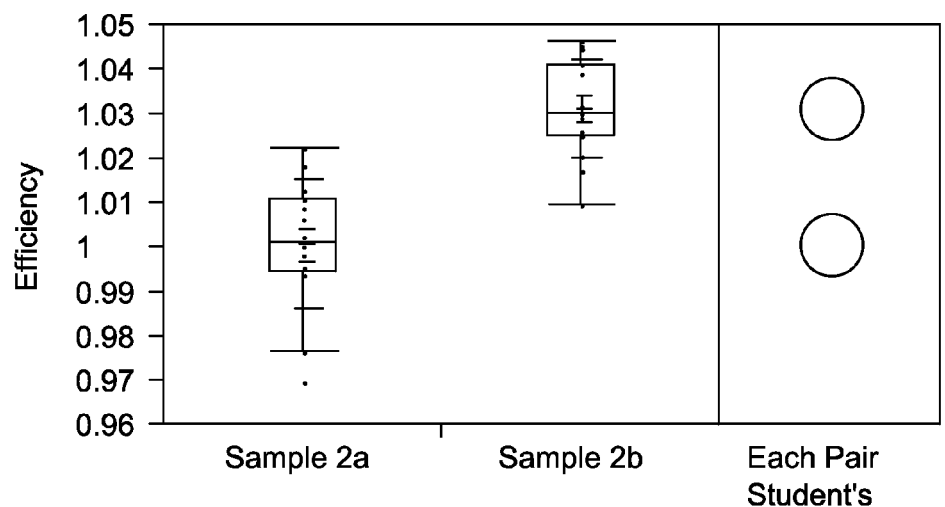
FIG. 6A is a box plot of the normalized cell efficiencies for photovoltaic devices using CdS that either underwent an annealing step or was not annealed.
Figure 6B:
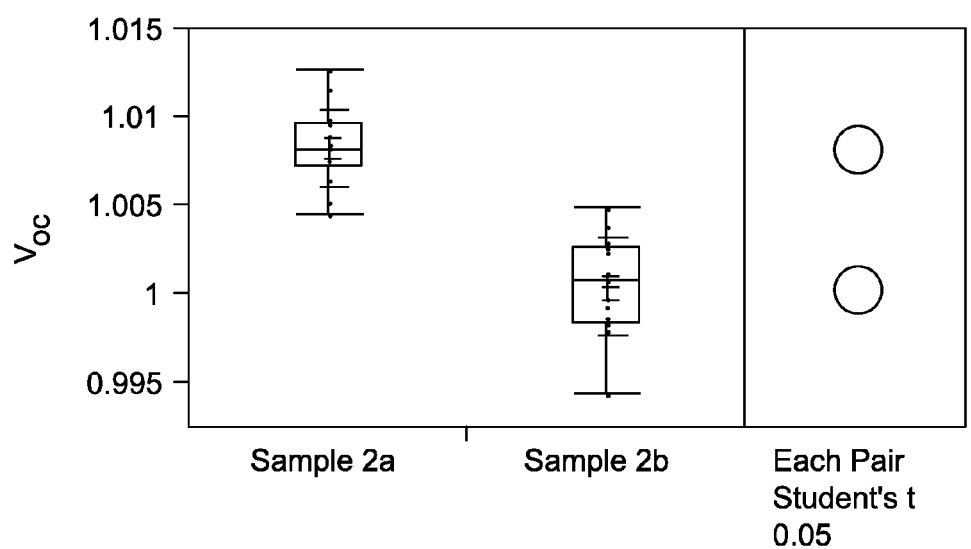
FIG. 6B is a box plot of the normalized open circuit voltage $V_{OC}$ for photovoltaic devices using CdS that either underwent an annealing step or was not annealed.
Figure 6C:
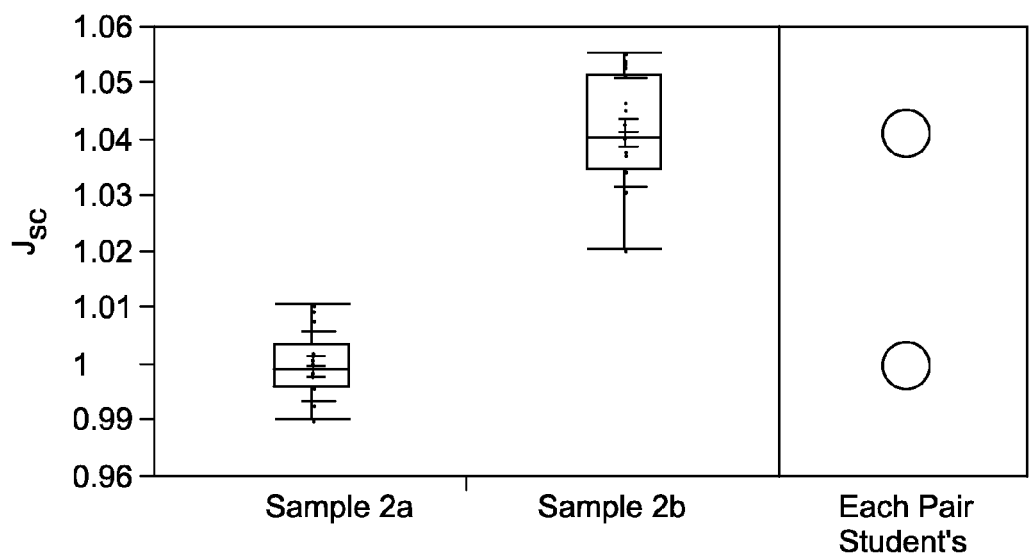
FIG. 6C is a box plot of the normalized short circuit current $J_{SC}$ for photovoltaic devices using CdS that either underwent an annealing step or was not annealed.
Figure 6D:
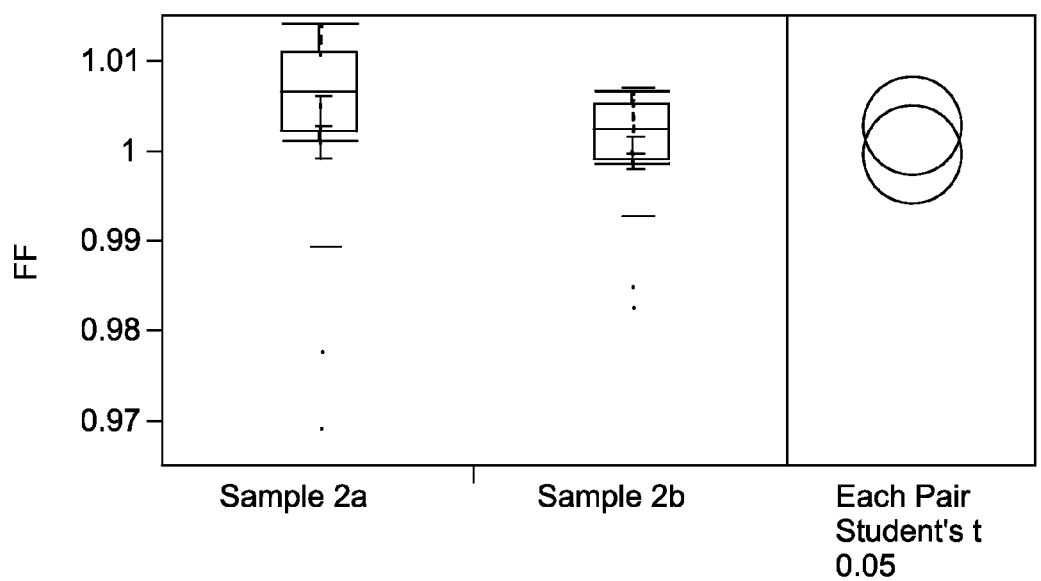
FIG. 6D is a box plot of the normalized fill factor FF for photovoltaic devices using CdS that either underwent an annealing step or was not annealed.

FIG. 6A shows that the cell efficiencies for the cell (Sample 2a) with CdS films annealed at pressure of about 100 Torr exceeded (greater than 3% increase) those of cells with CdS that was not annealed (Sample 2b). Similarly, FIGS. 6B, 6C, and 6D show the positive effect of annealing at high pressure (>10 Torr) on the open circuit voltage $V_{OC}$, short circuit current $J_{SC}$, and fill factor FF of cells with annealed CdS relative to the cells with un-annealed CdS.

Example 3

Annealing of CdS/ZnO/FTO/Glass Sample at Different Pressures

The multi-layered sample (semiconductor assembly 100) prepared in Example 1 was subjected to an annealing step at 630° C. for 10 min in a nitrogen ($N_2$) atmosphere at three different pressures: 10 Torr (Sample 3a), 100 Torr (Sample 3b), and 400 Torr (Sample 3c). The photovoltaic cells were completed by depositing a layer of cadmium telluride (CdTe) and formation of a back contact on the annealed CdS:O layer.

Figure 7A:
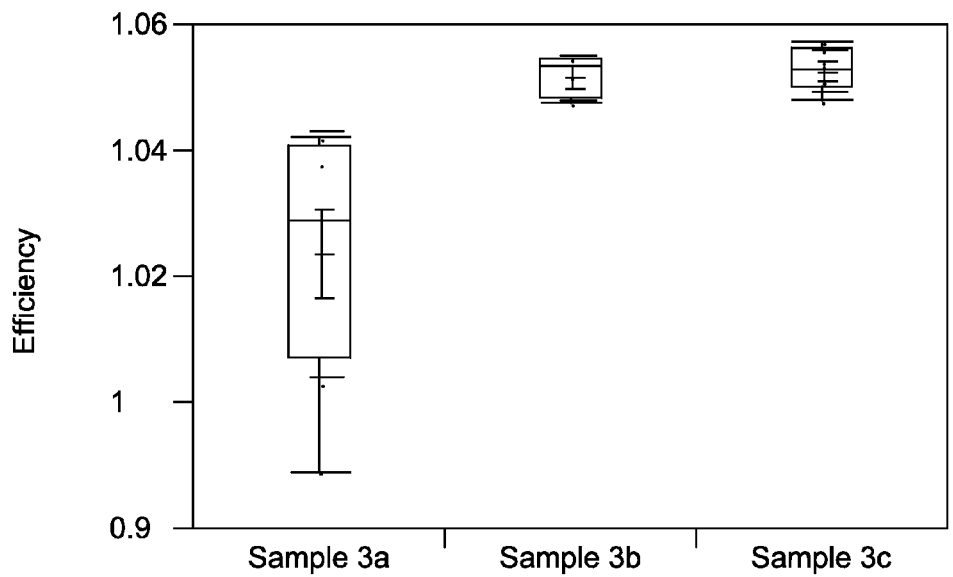
FIG. 7A is a box plot of the normalized cell efficiencies for photovoltaic devices using CdS that underwent annealing at different pressures.
Figure 7B:
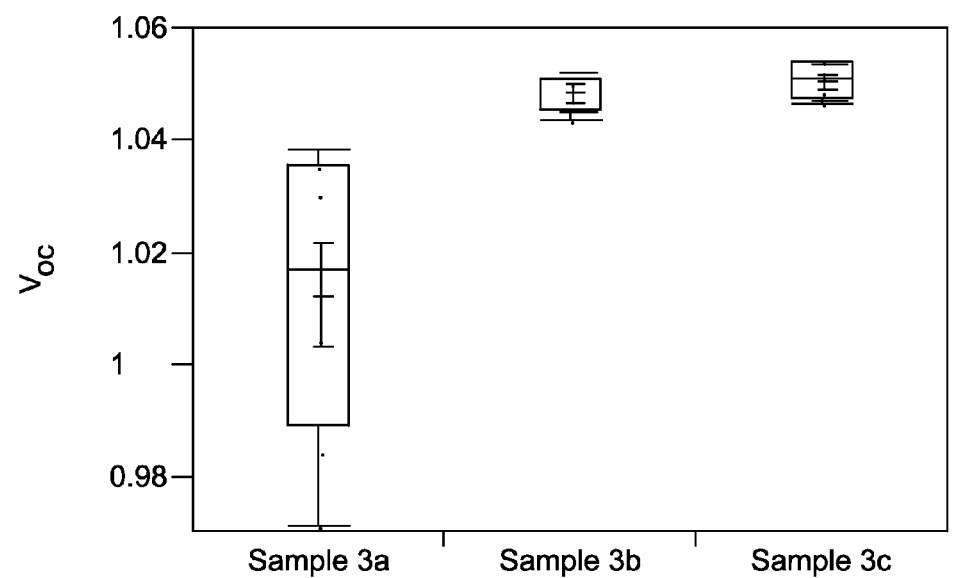
FIG. 7B is a box plot of the normalized open circuit voltage $V_{OC}$ for photovoltaic devices using CdS that underwent annealing at different pressures.
Figure 7C:
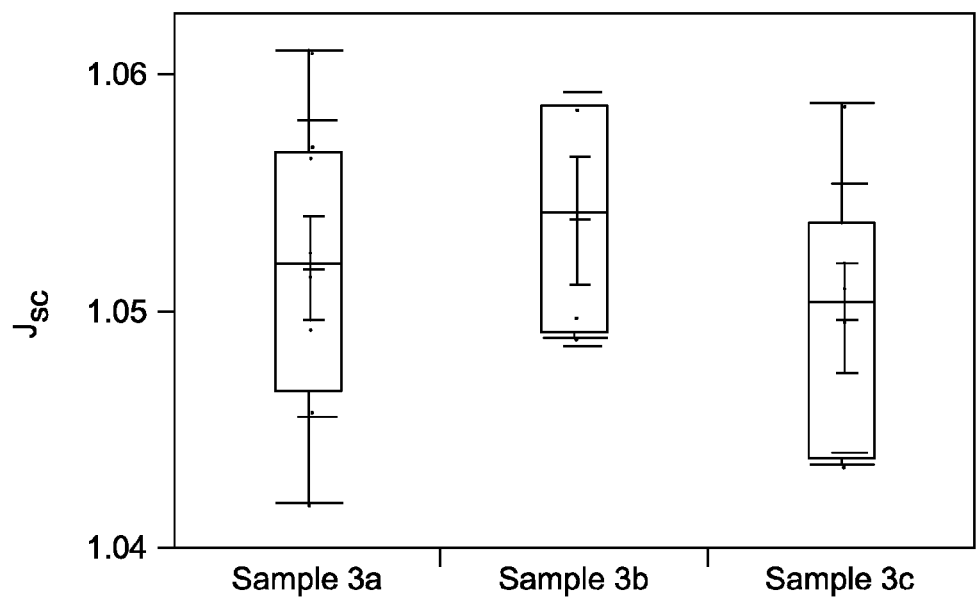
FIG. 7C is a box plot of the normalized short circuit current $J_{SC}$ for photovoltaic devices using CdS that underwent annealing at different pressures.
Figure 7D:
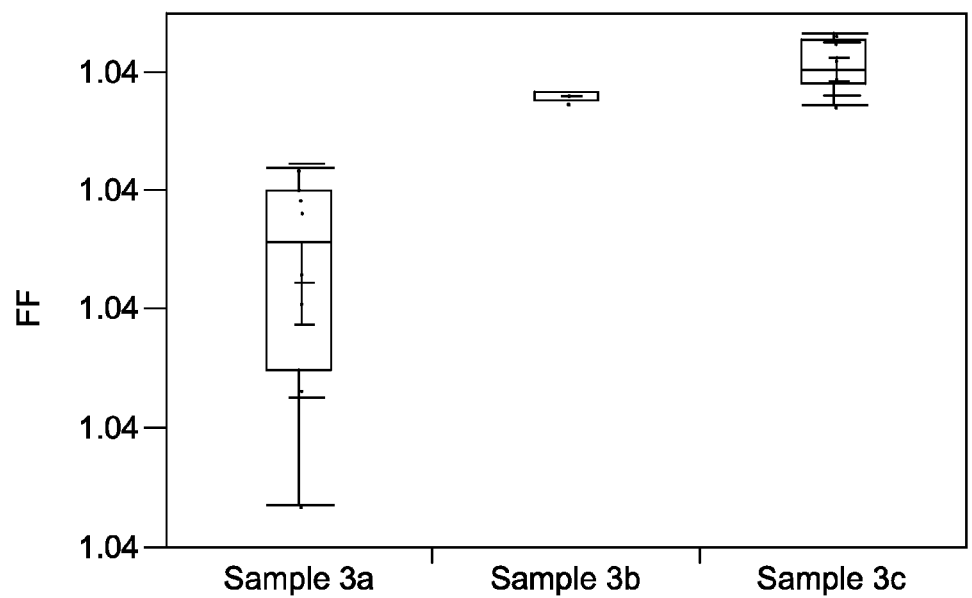
FIG. 7D is a box plot of the normalized fill factor FF for photovoltaic devices using CdS that underwent annealing at different pressures.

FIG. 7A shows the effect of annealing pressure on the cell efficiencies for the cells. Similarly, FIGS. 7B, 7C and 7D show the positive effect of annealing at high pressure (>10 Torr) on the open circuit voltage $V_{OC}$, short circuit current $J_{SC}$, and fill factor FF of cells with annealed CdS relative to the cells annealed at pressure of 10 Torr.

Without being bound by any theory, it is believed that by thermally processing the semiconductor assembly 100 at high pressures (>10 Torr), the vapor pressure of the semiconductor material (for example, CdS) may be maintained near the surface of the semiconductor layer 120, and thus the sublimation of the semiconductor material may be reduced. Thus, the above high-pressure thermal processing facilitates processing of semiconductor layer 120 at higher temperatures. These relatively high temperature thermal anneals may better recrystallize the semiconductor layer 120. Without being bound by a particular theory, it is believed that the above-described thermal processing may modify the microstructure and optical transmission of semiconductor layer 120, as well as improve the interface between the semiconductor layer 120 and the absorber layer (for example, CdTe) 130. As discussed above with reference to FIG. 6A, the thermally processed semiconductor layers 120 may lead to relatively high efficiency cells in comparison to un-annealed semiconductor layers.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A method, comprising: thermally processing a semiconductor layer including cadmium and sulfur in a non-oxidizing atmosphere at a pressure greater than about 10 Torr, wherein the semiconductor layer is disposed on a support forming a semiconductor assembly.

2. The method of claim 1, wherein the thermal processing is performed at a pressure greater than about 100 Torr.

3. The method of claim 1, wherein the thermal processing is performed at a pressure in a range from about 50 Torr to about 10 Atm.

4. The method of claim 1, wherein thermally processing the semiconductor assembly comprises heating the semiconductor assembly at a temperature in a range from about 500 degrees Celsius to about 700 degrees Celsius.

5. The method of claim 1, wherein the thermal processing is performed for a time duration in a range from about 2 minutes to about 40 minutes.

6. The method of claim 1, wherein the non-oxidizing atmosphere comprises an inert gas.

7. The method of claim 6, wherein the non-oxidizing atmosphere comprises nitrogen, argon, or combinations thereof.

8. The method of claim 1, wherein the thermal processing is performed with an overpressure of a vapor phase comprising cadmium, sulfur, or combinations thereof.

9. The method of claim 1, further comprising disposing the semiconductor layer on the support by physical vapor deposition to form the semiconductor assembly.

10. The method of claim 1, further comprising disposing the semiconductor layer on the support by sputtering to form the semiconductor assembly.

11. The method of claim 1, wherein the semiconductor layer comprises cadmium sulfide, oxygenated cadmium sulfide, or combinations thereof.

12. The method of claim 1, wherein the semiconductor layer comprises oxygenated cadmium sulfide having an oxygen content in a range from about 1 weight percent to about 15 weight percent.

13. The method of claim 1, wherein the semiconductor assembly further comprises a transparent layer interposed between the support and the semiconductor layer.

14. The method of claim 13, wherein the transparent layer comprises cadmium tin oxide, indium tin oxide, zinc tin oxide, fluorine-doped tin oxide, indium-doped cadmium oxide, aluminum-doped zinc oxide, indium zinc oxide, or combinations thereof.

15. The method of claim 13, further comprising a buffer layer disposed on the transparent layer.

16. The method of claim 15, wherein the buffer layer comprises tin dioxide, zinc tin oxide, zinc oxide, indium oxide, zinc stannate, cadmium magnesium oxide, gallium oxide, or combinations thereof.

17. The method of claim 1, wherein the semiconductor assembly further comprises a back contact layer disposed on the support, and an absorber layer interposed between the back contact layer and the semiconductor layer.

18. The method of claim 17, wherein the absorber layer comprises cadmium telluride, cadmium zinc telluride, cadmium sulfur telluride, cadmium manganese telluride, cadmium magnesium telluride, copper indium sulfide, copper indium gallium selenide, copper indium gallium sulfide, or combinations thereof.

19. A method, comprising:
disposing a semiconductor layer on a support by physical vapor deposition to form a semiconductor assembly, wherein the semiconductor layer comprises cadmium and sulfur; and
thermally processing the semiconductor assembly in a non-oxidizing atmosphere at a pressure greater than about 10 Torr.

20. A method, comprising:
- disposing a transparent layer on a support;
- disposing a semiconductor layer on the transparent layer by sputtering to form a semiconductor assembly, wherein the semiconductor layer comprises cadmium and sulfur;
- thermally processing the semiconductor assembly in a non-oxidizing atmosphere at a temperature in a range from about 500 degrees Celsius to about 700 degrees Celsius and at a pressure greater than about 10 Torr;
- disposing an absorber layer on the semiconductor layer; and
- disposing a back contact layer on the absorber layer.

\* \* \* \* \*